(12) United States Patent
Wilson et al.

(10) Patent No.: US 6,782,068 B1
(45) Date of Patent: Aug. 24, 2004

(54) PLL LOCKOUT WATCHDOG

(75) Inventors: James E. Wilson, Woodinville, WA (US); Tomasz Cowe, Woodinville, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 679 days.

(21) Appl. No.: 09/608,753

(22) Filed: Jun. 30, 2000

(51) Int. Cl.[7] ............................................. H03D 3/24
(52) U.S. Cl. ..................... 375/376; 375/373; 375/355; 375/354; 375/327
(58) Field of Search ................... 375/376, 136, 375/137, 354, 355, 327, 373, 351; 371/62; 331/11, 1 A; 327/156

(56) References Cited

U.S. PATENT DOCUMENTS

| 4,689,740 | A | | 8/1987 | Moelands et al. ........... 364/200 |
|---|---|---|---|---|
| 5,015,970 | A | * | 5/1991 | Williams et al. ............... 331/11 |
| 5,304,954 | A | * | 4/1994 | Saito et al. .................. 331/1 A |
| 5,525,932 | A | * | 6/1996 | Kelkar et al. ............... 331/1 A |
| 5,559,502 | A | | 9/1996 | Schutte ................... 340/825.21 |
| 5,574,406 | A | * | 11/1996 | Sauer et al. ................... 331/11 |
| 5,689,196 | A | | 11/1997 | Schutte ......................... 326/86 |
| 5,864,572 | A | * | 1/1999 | Bhagwan .................... 714/815 |
| 6,005,904 | A | * | 12/1999 | Knapp et al. ............... 375/376 |
| 6,211,739 | B1 | | 4/2001 | Synder et al. .............. 331/1 A |
| 6,621,480 | B1 | | 9/2003 | Morita ........................ 345/99 |
| 6,625,435 | B1 | | 9/2003 | Ramesh ..................... 455/313 |
| 6,628,276 | B1 | | 9/2003 | Elliott ........................ 345/213 |
| 6,629,223 | B2 | | 9/2003 | Bachot et al. .............. 711/167 |
| 6,633,991 | B1 | | 10/2003 | Goldrian ..................... 713/400 |

* cited by examiner

Primary Examiner—Stephen Chin
Assistant Examiner—Ted Wang
(74) Attorney, Agent, or Firm—Christopher P. Maiorana, P.C.

(57) ABSTRACT

A circuit that may be configured to detect a lockout condition of a phase lock loop (PLL) circuit. The circuit may be configured to forcibly correct an operating frequency of the PLL circuit.

14 Claims, 3 Drawing Sheets

PLL LOCKOUT WATCHDOG

FIELD OF THE INVENTION

The present invention relates to a method and/or architecture for watchdog timers generally and, more particularly, to a method and/or architecture for implementing a Phase Locked Loop (PLL) lockout watchdog timer.

BACKGROUND OF THE INVENTION

A lockout (or runaway) condition occurs in a PLL following fault clearing when a circuit will not attempt to reclose (i.e., recover or re-acquire) the loop. Transformers, generators, and buses typically trip once and lockout immediately. Transmission lines and distribution lines will generally attempt one or more recloses (recoveries), and will then lockout if the fault remains following the last unsuccessful recovery attempt in the sequence. Conventional correction methods for lookout conditions typically require a reset of the device.

Referring to FIG. 1, a conventional PLL lock detector circuit 10 is shown. The circuit 10 has the disadvantages of not distinguishing between lockout, powerup, and frequency acquisition. The circuit 10 cannot detect when a PLL is locked on a harmonic. Furthermore, the circuit 10 requires additional circuitry to recover from a lockout.

SUMMARY OF THE INVENTION

The present invention concerns a circuit that may be configured to detect a lockout condition of a phase lock loop (PLL) circuit. The circuit may be configured to forcibly correct an operating frequency of the PLL circuit.

The objects, features and advantages of the present invention include providing a PLL lockout watchdog that may (i) detect a lockout (e.g., a runaway) condition; (ii) detect and correct a lockout (runaway) condition; and (iii) switch to a recovery feedback path during a first mode (e.g., a lockout).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
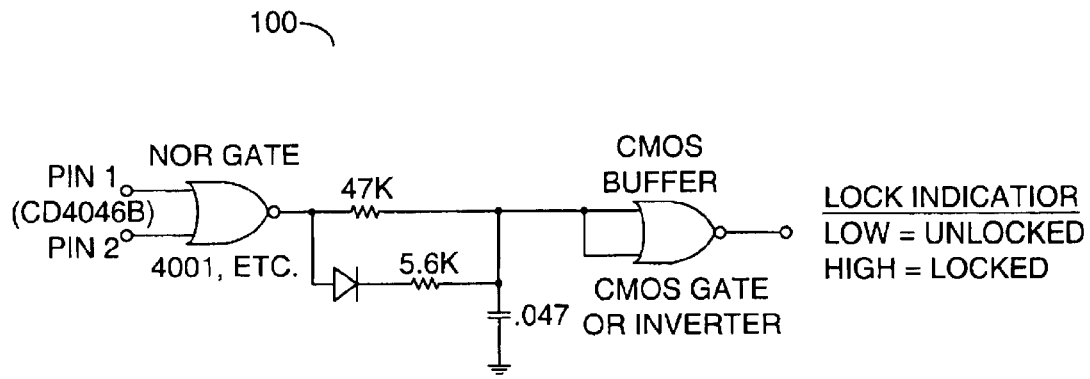
FIG. 1 is a block diagram of a conventional PLL Lock detector.
Figure 2:
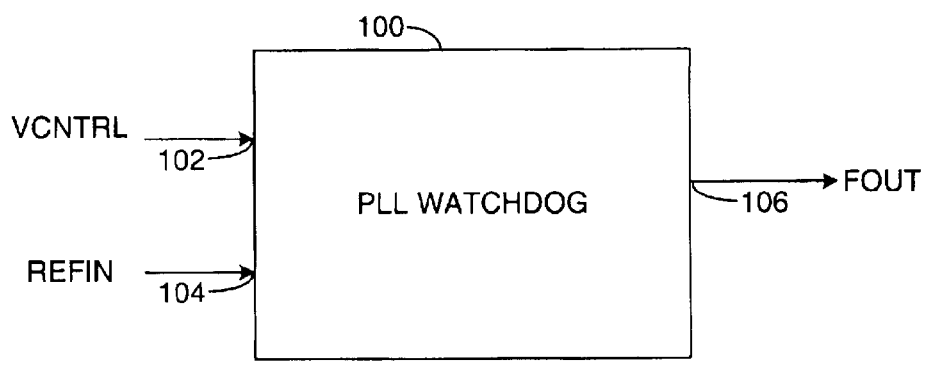
FIG. 2 is a block diagram of a preferred embodiment of the present invention.

Referring to FIG. 2, a block diagram of a circuit (or system) 100 is shown in accordance with a preferred embodiment of the present invention. The circuit 100 may be implemented, in one example, as a lockout watchdog circuit. The lockout watchdog circuit may detect a lockout (e.g., a runaway) condition. The circuit 100 may detect and correct such a lockout condition when implemented, for example, in a phase lock loop (PLL) circuit. The circuit 100 may switch to a recovery feedback path during a first mode (e.g., a lockout mode) and then switch back to a normal feedback path when a second mode (e.g. a normal mode).

The circuit 100 may have an input 102 that may receive a signal (e.g., VCNTRL), an input 104 that may receive a signal (e.g., REFIN) and an output 106 that may present a signal (e.g., FOUT). The signal FOUT may have a frequency that is generated in response to the signal VCNTRL and the signal REFIN. The signal REFIN may be implemented, in one example, as a reference frequency. The signal VCNTRL may be implemented, in one example, as a voltage control signal. However, the signal REFIN and the signal VCNTRL may be implemented as other appropriate type signals in order to meet the criteria of a particular implementation.

Figure 3:
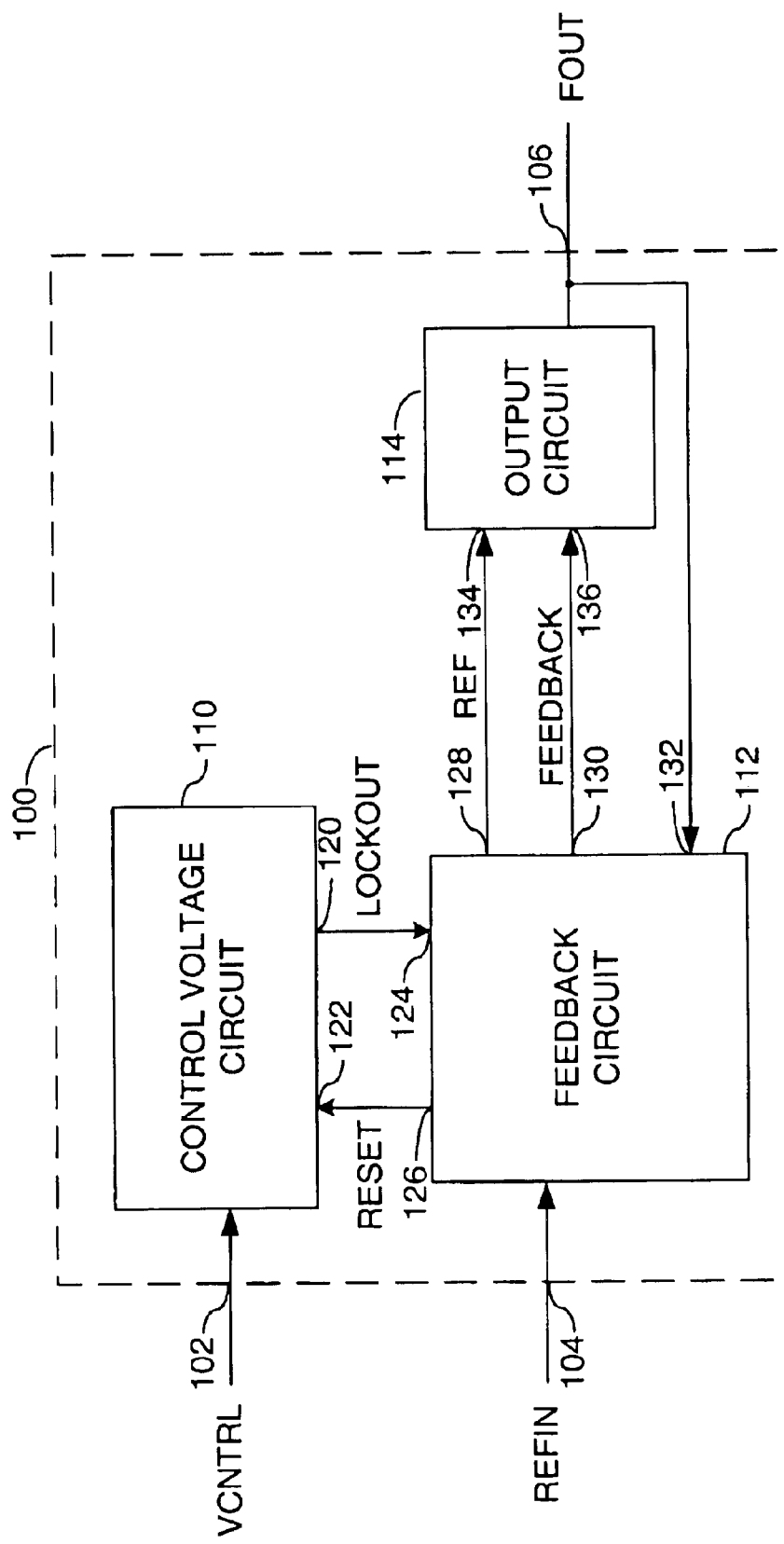
FIG. 3 is a detailed block diagram of the present invention.

Referring to FIG. 3, a more detailed diagram of the circuit 100 is shown. The structure of the circuit 100 generally comprises a block (or circuit) 110, a block (or circuit) 112 and a block (or circuit) 114. The circuit 110 may be implemented, in one example, as a control voltage circuit. The circuit 112 may be implemented, in one example, as a feedback circuit. In another example, the circuit 112 may be implemented as a lockout correction circuit. The circuit 114 may be implemented, in one example, as an output circuit. The control voltage circuit 110 may have an output 120 that may present a signal (e.g., LOCKOUT) and an input 122 that may receive a signal (e.g., RESET). The signal LOCKOUT may be generated in response to the signal VCNTRL and the signal RESET. The feedback circuit 112 may have an input 124 that may receive the signal LOCKOUT, an output 126 that may present the signal RESET, an output 128 that may present a signal (e.g., REF), an output 130 that may present a signal (e.g., FEEDBACK) and an input 132 that may receive the signal FOUT. The output circuit 114 may have an input 134 that may receive the signal REF and an input 136 that may receive the signal FEEDBACK. The output circuit 114 generally presents the signal FOUT in response to the signal REF and the signal FEEDBACK. In one example, the signal REF may be implemented as a reference frequency and the signal FEEDBACK may be implemented as a feedback signal. In another example, the signal REF and the signal FEEDBACK may be implemented as a feedback path. However, a particular signal type of the signal REF and FEEDBACK may be varied in order to meet the criteria of a particular implementation.

Figure 4:
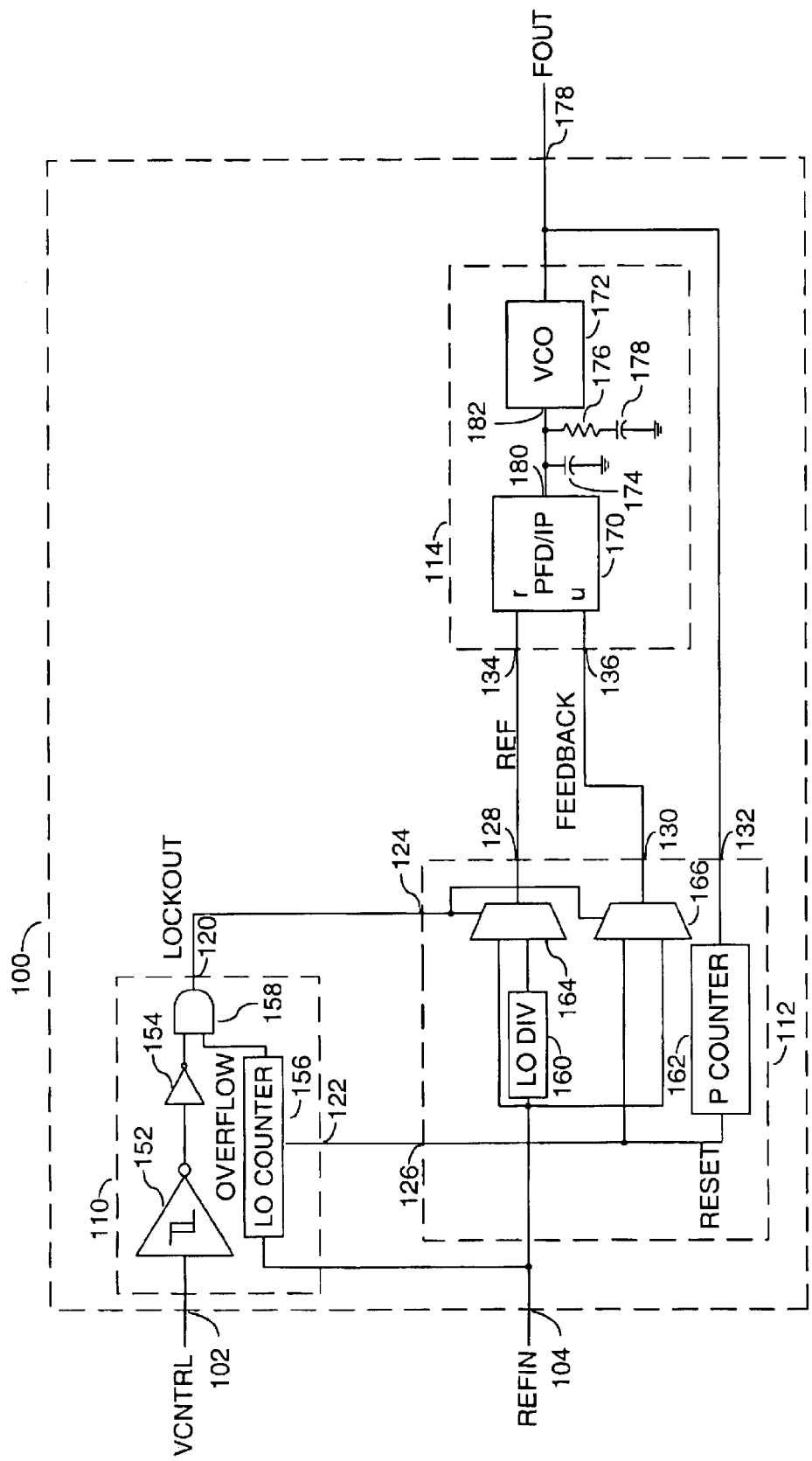
FIG. 4 is a more detailed block diagram of the present invention.

Referring to FIG. 4, a more detailed diagram of the circuit 100 is shown. The circuit 110 is shown comprising a circuit 152, an inverter 154, a counter 156 and a gate 158. The circuit 152 may be implemented, in one example, as a schmitt trigger. The counter 156 may be implemented, in one example, as a lockout counter. The gate 158 may be implemented, in one example, as an AND gate.

The circuit 112 is shown comprising a divider 160, a counter 162, a multiplexer 164 and a multiplexer 166. The divider 160 may be implemented, in one example, as a lockout divider. The counter 162 may be implemented, in one example, as a reference frequency (e.g., P) counter. The multiplexer 164 generally multiplexes the signal REFIN and the divided signal REFIN in response to the signal LOCKOUT. The multiplexer 164 generally presents the signal REF in response to the signal REFIN, the divided output of the divider 160 and the signal LOCKOUT. The multiplexer 166 generally multiplexes the signal REFIN and the signal RESET in response to the signal LOCKOUT. The multiplexer 166 generally presents the signal FEEDBACK in response to the signal RESET, the signal REFIN and the signal LOCKOUT. The multiplexers 164 and 166 may be controlled in response to a lockout condition (e.g., the signal LOCKOUT).

The output circuit 114 generally comprises a phase frequency detector and charge pump (PFD/IP) 170 and a voltage controlled oscillator (VCO) 172. The circuit 114 may also comprise a capacitor 174, a resistor 176 and a capacitor 178. The PFD/IP 170 may have an output 180 that may be connected to a node (e.g., V). The node V may be connected to an input 182 of the VCO 172. Additionally, the node V may be coupled to the capacitor 174 and the capacitor 178 via the resistor 176. The capacitor 174, the resistor 176 and the capacitor 178 may be implemented to provide filtering between the PFD/IP 170 and the VCO 172. A slew rate of the PLL 100 may be determined by the capacitor 174, the resistor 176 and the capacitor 178. However, the particular magnitudes of the filter elements 174, 176 and 178 may be varied accordingly to meet the design criteria of a particular implementation.

Generally, the watchdog circuit 100 may have two feedback paths (e.g., a test feedback path and a normal feedback path each comprising the signal REF and the signal FEEDBACK). The test and normal feedback paths may be controlled by the multiplexers 164 and 166, respectively. The first feedback path (e.g., the divided signal REFIN and the signal REFIN via the multiplexers 164 and 166) may be a recovery operation path. The second feedback path (e.g., the signal REFIN and the signal RESET via the multiplexers 164 and 166) may be a normal operation path. The recovery feedback path may utilize a higher speed (e.g., frequency) than the normal operation feedback path. When a lockout condition is detected, the feedback path is generally switched from the normal path to the recovery path. The recovery path may force the PLL circuit 100 to normal operation. The normal feedback path may be switched back to the operating feedback path after the PLL circuit 100 has recovered via the recovery feedback path.

The circuit 100 may allow correction of a lockout condition by providing PLL lockout correction (e.g., the feedback circuit 112) in addition to the normal operational of a PLL circuit. The output of the divider 160 (e.g., the divided reference frequency REFIN) may be higher than the normal operation frequency REFIN of the circuit 100. The divided reference frequency REFIN may allow the correction circuit 112 to force the PLL 110 back to the normal frequency mode. The lockout divider 160 may divide the reference frequency REFIN to a particular level. The divided reference frequency (via the multiplexer 164) and the reference frequency REFIN (via the multiplexer 166) may be implemented as a correction feedback path.

The P counter overflow (e.g., the signal RESET) is generally sent to the lockout counter 156. When the signal VCNTRL is high but the P counter 162 has no output, a lockout condition is generally detected. The reference frequency counter 162 may generate the signal RESET to switch the feedback path of the phase frequency detector and charge pump 170. The signal VCNTRL is generally forced down by the PFD/IP 170 and the PLL 100 may recover to the normal operation frequency. The PFD/IP 170 may detect that the signal FEEDBACK is faster than the clock signal REF and discharge a voltage of the node V via the filter elements 174, 176 and 178. The voltage on the node V may be implemented as the voltage control signal VCNTRL. The PFD/IP 170 and the filter elements 174, 176 and 178 may be implemented to generate the voltage control VCNTRL. The PLL 100 may switch back to the normal feedback path in response to a voltage of the voltage control signal VCNTRL and the signal RESET. Thus, normal operation of the PLL circuit 100 may resume. The watchdog circuit 100 may be configured to operate if the signal VCNTRL is above a predetermined threshold voltage of the schmitt trigger 152, which may produce an otherwise undetected runaway condition. Additionally, the watchdog circuit 100 may be configured to not operate if the signal VCNTRL is below a predetermined threshold voltage of the schmitt trigger 152.

The circuit 100 may detect a runaway condition in a PLL. The circuit 100 may be implemented where a conventional feedback path is not fast enough to provide an accurate feedback and may essentially return a zero frequency. If the feedback path is not adequate, the circuit 100 may switch the feedback path to a high frequency comparison with the reference path (e.g., compare the output of the divider 160 and the reference REFIN). The higher frequency on the feedback path may allow the phase frequency detector and charge pump 170 to pump a voltage of the signal VCNTRL down. The lower voltage signal VCNTRL may slow down the frequency of the circuit 100. The frequency may be slowed allowing the PLL circuit 100 to generate clock pulses on a signal (e.g., RESET). Clock pulses of the signal RESET may reset the lockout counter 156 via the feedback (e.g., P counter) frequency counter 162. The lockout counter 156 may switch the circuit 100 back to the normal feedback path upon a reset. The circuit 100 may implement two feedback paths, one for normal operations and the second for lockout operations. The circuit 100 may implement other numbers of feedback paths and/or recovery paths in order to meet the criteria of a particular design. However, only two paths may be required at any particular time (e.g., a reference path and a feedback path).

The lockout counter 156 may detect a lockout condition of the circuit 100 and then may switch to the high frequency feedback path via the signal RESET. The lockout counter 156 may be clocked by the signal REFIN. The lockout counter 156 may be implemented to count to a predetermined number. A count time (e.g., number of counted cycles) of the lockout counter 156 may be relative to the frequency of the signal REFIN. The count time may be microseconds long. The counter 156 may be allowed to count to a predetermined count value without being reset by the signal RESET. A signal (e.g., OVERFLOW) of the lockout counter 156 may switch the feedback path of the PLL 100 when the signal VCNTRL is high. The signal FEEDBACK is generally at a higher frequency then when the PFD/IP 170 is pumped down.

If the control voltage VCNTRL is greater than a voltage of the schmitt trigger 152 a lockout condition may be detected. However, the reference frequency counter 162 may output pulses such that the control voltage VCNTRL is generally less than the voltage level of the schmitt trigger. However, the recovery feedback path may generate a glitch when the PLL 100 is locked out and the control voltage VCNTRL is high. The glitch may reset (via the signal RESET) the lockout counter 156 and switch the circuit 100 back to the normal feedback path when the control voltage VCNTRL is high. Hysteresis of the circuit 100 generally causes the control voltage VCNTRL to be pumped down to a safe operating range. Hysteresis is generally considered to be the measure of a comparator for which an input threshold changes as a function of an input (or output) level. If the normal operation (normal feedback path) is resumed when the voltage control signal VCNTRL is high, the circuit 100 may remain in a lockout state. Hysteresis may prevent the circuit 100 from switching back to the normal mode feedback path on output glitches.

When the control voltage VCNTRL is at a power rail potential the loop is essentially running to fast for the circuit 100 to operate and may not generate a feedback frequency (e.g., the signal RESET). Additionally, if the control voltage VCNTRL is at ground, the voltage potential may be too low for the circuit 100 to operate and may not generate the output frequency FOUT. The circuit may detect if the control voltage VCNTRL is high enough for correct operation. Additionally, the circuit 100 may detect if the control voltage VCNTRL is high enough and a lockout condition occurs. The circuit 100 may switch to the higher frequency feedback path if the lockout condition occurs. The circuit 100 may implement the lockout counter 156 to switch the feedback path of the PLL 100. During the normal operation of the circuit 100 the signal REFIN and the signal RESET may be multiplexed to provide the feedback path of the PLL 100. During the recovery operation of the circuit 100, the signal REFIN and the divided signal REFIN (via the lockout divider 160) may be multiplexed to provide the feedback path of the PLL 100. The circuit 100 may have a recovery feedback path that may have a greater frequency than the normal feedback path.

While the invention has been particularly shown and described with reference to the preferred embodiments thereof, it will be understood by those skilled in the art that various changes in form and details may be made without departing from the spirit and scope of the invention.

What is claimed is:

1. A circuit configured to detect a lockout condition of a phase lock loop (PLL) circuit, wherein (A) said circuit is configured to forcibly correct an operating frequency of the PLL circuit by (i) switching to a normal path comprising a feedback of said operating frequency when said lockout condition is not detected and (ii) switching to a recovery path, separate from said feedback of said operating frequency, when said lockout condition is detected and (B) said circuit comprises a first counter configured to (a) count an output reference frequency and (b) initiate a reset of said circuit.

2. The circuit according to claim 1, wherein said recovery path receives a reference frequency.

3. The circuit according to claim 1, wherein said recovery path comprises a first frequency higher than a second frequency of said normal path.

4. The circuit according to claim 1, wherein said circuit comprises a PLL lockout watchdog circuit.

5. The circuit according to claim 1, further configured to switch between a first and a second feedback path.

6. The circuit according to claim 5, further configured in response to an output of said PLL circuit.

7. The circuit according to claim 6, wherein said output initiates a reset of said circuit.

8. The circuit according to claim 1, further configured in response to a control voltage signal.

9. The circuit according to claim 8, further configured to control a voltage level of said control voltage signal.

10. The circuit according to claim 1, further configured in response to a reference frequency.

11. The circuit according to claim 1, further comprising:

a second counter configured to count an input reference frequency and initiate a lockout condition.

12. A method for detecting a lockout condition comprising the steps of:

(A) detecting a lockout condition of a phase lock loop (PLL) circuit;

(B) forcibly correcting an operating frequency of the PLL by (i) switching to a normal path comprising a feedback of said operating frequency when said lockout condition is not detected and (ii) switching to a recovery path, separate from said feedback of said operating frequency, when said lockout condition is detected; and (C) counting an output reference frequency to initiate a reset of said PLL.

13. The method according to claim 1, wherein said recovery path receives a reference frequency.

14. An apparatus comprising:

means for detecting a lockout condition of a phase lock loop (PLL) circuit;

means for correcting an operating frequency of the PLL circuit by (i) switching to a normal path comprising a feedback of said operating frequency when said lockout condition is not detected and (ii) switching to a recovery path, separate from said feedback of said operating frequency, when said lockout condition is detected; and means for (a) counting an output reference frequency and (b) initiating a reset of said apparatus.

* * * * *

UNITED STATES PATENT AND TRADEMARK OFFICE
CERTIFICATE OF CORRECTION

| | | |
|---|---|---|
| PATENT NO. | : 6,782,068 B1 | Page 1 of 1 |
| APPLICATION NO. | : 09/608753 | |
| DATED | : August 24, 2004 | |
| INVENTOR(S) | : James E. Wilson and Tomasz Cewe | |

It is certified that error appears in the above-identified patent and that said Letters Patent is hereby corrected as shown below:

On Title Page, item (75) Inventors, "Cowe" should be changed to --Cewe--.

Signed and Sealed this

Thirtieth Day of October, 2012

David J. Kappos
*Director of the United States Patent and Trademark Office*